(12) United States Patent
Furuichi et al.

(10) Patent No.: US 6,635,220 B2
(45) Date of Patent: Oct. 21, 2003

(54) METHOD FOR FORMING COMPOSITE VAPOR-DEPOSITED FILMS WITH VARIED COMPOSITIONS FORMED IN THE INITIAL AND FINAL STAGES OF DEPOSITION, COMPOSITE VAPOR-DEPOSITION MATERIAL FOR THE FILM AND METHOD FOR MANUFACTURE THEREOF

(75) Inventors: Shinji Furuichi, Mohka (JP); Shigetoshi Takashima, Sakado (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 09/987,048

(22) Filed: Nov. 13, 2001

(65) Prior Publication Data

US 2002/0048528 A1 Apr. 25, 2002

Related U.S. Application Data

(62) Division of application No. 09/534,039, filed on Mar. 24, 2000, now Pat. No. 6,372,362.

(30) Foreign Application Priority Data

Mar. 25, 1999 (JP) .............................................. 11-80791

(51) Int. Cl.$^7$ .................................................. B22F 7/00
(52) U.S. Cl. ............................. 419/8; 419/66; 427/124; 427/69; 427/250
(58) Field of Search ........................ 419/8, 66; 427/69, 427/124, 250

(56) References Cited

U.S. PATENT DOCUMENTS

| | | | |
|---|---|---|---|
| 3,322,515 A | 5/1967 | Dittrich et al. | |
| 3,703,401 A | 11/1972 | Deal et al. | 117/33.5 |
| 3,862,286 A | 1/1975 | Couchman | 428/558 |
| 4,148,971 A | 4/1979 | Kawanao et al. | 428/558 |
| 4,423,119 A | 12/1983 | Brown et al. | 428/558 |
| 4,578,114 A | 3/1986 | Rangaswamy et al. | 75/252 |
| 6,190,740 B1 | 2/2001 | Rogers | 427/446 |

Primary Examiner—Ngoclan Mai
(74) Attorney, Agent, or Firm—Sughrue Mion, PLLC (57) ABSTRACT

A method for forming a composite vapor-deposited film one side of which suitable for vapor-deposition on a phosphor surface of a CRT, such as a color television picture tube, has high light reflectivity, and the other side of which has a property to absorb radiant heat, and a composite vapor-deposition material suitable for vacuum deposition are disclosed. The composite vapor-deposition material has a high vapor-pressure metal envelope and a low vapor-pressure metal in the core region of the envelope. Low vapor-pressure metal powder should preferably be dispersed and held by high vapor-pressure metal powder in the core region. Vacuum deposition using this composite vapor-deposition material yields a composite deposited film having a composition comprising almost 100% of the high vapor-pressure metal formed in the initial stage of evaporation, and a composition comprising 100% of the low vapor-pressure metal formed in the final stage of evaporation.

7 Claims, 6 Drawing Sheets

METHOD FOR FORMING COMPOSITE VAPOR-DEPOSITED FILMS WITH VARIED COMPOSITIONS FORMED IN THE INITIAL AND FINAL STAGES OF DEPOSITION, COMPOSITE VAPOR-DEPOSITION MATERIAL FOR THE FILM AND METHOD FOR MANUFACTURE THEREOF

This application is a division of application Ser. No. 09/534,039, filed Mar. 24, 2000, now U.S. Pat. No. 6,372,362.

FIELD OF THE INVENTION

The present invention relates to a method for forming composite vapor-deposited films with different film compositions formed in the initial and final stages of evaporation in a continuous vacuum vapor-deposition process, and a composite vapor-deposition material suitable for use in vacuum vapor-deposition. More particularly, the present invention relates to a method for forming a composite vapor-deposited film with film compositions greatly varied as found in a light reflecting film and an optical absorption film provided on a phosphor surface in a cathode-ray tube, such as a color television picture tube, and a composite vapor-deposition material suitable for use in vacuum vapor-deposition.

DESCRIPTION OF THE RELATED ART

The need for forming a plurality of laminated vapor-deposited films having different properties in a continuous vacuum vapor-deposition process arises. In a cathode-ray tube, such as a color television picture tube, for example, phosphors of three colors are applied in a dotted or striped pattern to the inside surface of the faceplate, with a thin-film layer having a high light reflectivity, such as aluminum, formed on the phospher-coating, that is, the surface opposite to the faceplate, so that the light going toward the inside of the CRT among visible light emitted from the phosphors is reflected by the aluminum thin-film layer to increase the amount of light reaching the front surface of the faceplate. In rear of the phosphor-coated faceplate surface disposed is a shadow mask, or an aperture mask, that acts as color selecting electrodes to control the position on the phosphor faceplate at which each of electron beams from the electron gun can strike only its intended color phosphor dot. These electrodes allow about 20% of the electron beams to pass through the shadow mask to the side of the phosphor-coated surface, while shielding the remaining 80%. The shielded 80% of the electron beams contributes to a temperature rise in the color selecting electrodes. The temperature rise causes heat radiation from the color selecting electrodes, which is concentrated to the closest phosphor-coated surface, with most of the heat reflected by an aluminum mirror backing provided on the phosphor-coated faceplate. Since the reflected heat reaches the color selecting electrodes again, the temperature rise in the electrodes is further facilitated. With the temperature rise, the color selecting electrodes may be deformed due to thermal expansion, leading to misalignment of the electron beams.

Previous efforts to cope with this have included the application of a carbon coating on the surface of an aluminum film layer provided on the phosphor surface, as disclosed in U.S. Pat. No. 3,703,401, so that radiant heat from color selecting electrodes can be absorbed by the heat absorbing effect of the carbon coating. Carbon coating, however, has to be sprayed after dissolved in a solvent, such as an organic solvent. Moreover, this spray coating must be carried out separately from the process of vacuum vapor-deposition of aluminum onto the phosphor surface. This makes the process complex and troublesome, and continuous operation impossible.

When carbon or chromium, both having a radiant-heat absorbing property, is vacuum vapor-deposited together with aluminum having a high light reflectivity, a composite vapor-deposited film having an aluminum-rich composition formed in the initial stage of the vapor-deposition and a carbon- or chromium-rich composition formed in the final stage can be expected due to a difference in vapor pressure between aluminum and carbon or chromium. The aluminum-rich composition formed in the initial stage, however, has a low light reflectivity due to the high content of carbon or chromium. The carbon- or chromium-rich composition formed in the final stage, on the other hand, contains a large amount of aluminum, leading to a meager level of radiant-heat absorption.

To cope with this, a vapor-deposited film having a double-layer construction consisting of entirely different compositions can be obtained by first forming a vapor-deposited film by placing an aluminum block as an initial vapor-deposition material on an evaporation tray, and then continuing evaporation by placing an vapor-deposition material, such as carbon or chromium, that is different from the initial vapor-deposition material on the evaporation tray. This, however, involves two separate vapor-deposition procedures.

SUMMARY OF THE INVENTION

It is therefore an object of the present invention to provide a method for forming a composite vapor-deposited film having different film compositions formed in the initial and final state of vapor-deposition in a continuous vacuum vapor-deposition process.

It is another object of the present invention to provide a composite vapor-deposition material suitable for forming a composite vapor-deposited film having different film compositions formed in the initial and final state of vapor-deposition.

It is a further object of the present invention to provide an elongated composite vapor-deposition material having metals, alloys, their oxides, or their mixtures, that are relatively hard to elongate.

It is still a further object of the present invention to provide a composite vapor-deposition material that can be automatically fed to a vacuum vapor-deposition apparatus with ease.

It is still a further object of the present invention to provide a method for manufacturing a composite vapor-deposition material.

Accordingly, the method for forming a composite vapor-deposited film having different film compositions formed in the initial and final stages of vapor-deposition according to the present invention involves heating under reduced pressure a composite vapor-deposition material having a high vapor-pressure metal body, and a low vapor-pressure metal held in the core region of the body, and then vaporizing the high vapor-pressure metal and the low vapor-pressure metal to deposit them on a substrate being deposited.

In the present specification, high vapor-pressure metals are defined as metals that vaporize at relatively low temperatures, and low vapor-pressure metals are defined as metals that do not vaporize unless heated to relatively high temperatures, when dissimilar metals are heated in the same degree of vacuum.

The low vapor-pressure metal may be a powder dispersed and held by the high vapor-pressure metal powder in the core region of a high vapor-pressure metal body in a composite vapor-deposition material. The high vapor-pressure metal body should preferably be of the same metal as used for the high vapor-pressure metal powder, and more preferably be aluminum or its alloy. The high vapor-pressure metal should preferably have a higher ductility than the low vapor-pressure metal. The low vapor-pressure metal powder can be at least any one element selected from the group consisting of carbon, silicon, chromium, nickel, iron, cobalt, titanium, rhenium, tungsten and vanadium.

The low vapor-pressure metal may be a bulk covered by an envelope of a metal that has a higher vapor pressure and higher ductility in a composite vapor-deposition material. The high vapor-pressure metal should preferably be aluminum or its alloy, while the low vapor-pressure bulk metal should preferably be at least any one element selected from the group consisting of beryllium, tin, gold, iron, cobalt, nickel, titanium, platinum, rhodium, niobium, tantalum, rhenium and tungsten.

This composite vapor-deposition material may have a foil or layer of a lower vapor-pressure metal, which should preferably be niobium, tantalum, rhenium or tungsten, enclosing the core region.

The composite vapor-deposition material according to the present invention may have a composite construction in which a high vapor-pressure metal envelope having a cavity inside thereof, and a mixture of a high vapor-pressure metal and a low vapor-pressure metal packed into the cavity are integrally cold worked so as to cause the low vapor-pressure metal powder to be dispersed and held by the high vapor-pressure metal powder in the core region of the high vapor-pressure metal body.

The method for manufacturing the composite vapor-deposition material according to the present invention has a process of obtaining a composite construction in which the low vapor-pressure metal powder is dispersed in the core region of the envelope by mixing a high vapor-pressure metal powder with a lower vapor-pressure metal powder, packing the mixture powder into a high vapor-pressure metal envelope, and reducing the diameter of the envelope by cold working. The high vapor-pressure metal used here should preferably be aluminum or an aluminum alloy. The cold working should preferably be cold wire drawing. The total reduction ratio in cold wire drawing should preferably be not less than 75%. The angle of repose of the mixture powder should preferably be not more than 45 degrees.

In the method for manufacturing the composite vapor-deposition material according to the present invention, ends, including closed ends, of a plurality of cold-drawn aluminum or aluminum-alloy envelopes can be cut and discarded, and the envelopes thus obtained can be connected to each other at the cut portions by welding for further cold wire drawing.

DERTAILED DESCRIPTION OF THE PREFERRED EMBODIMENTS

Figure 1:
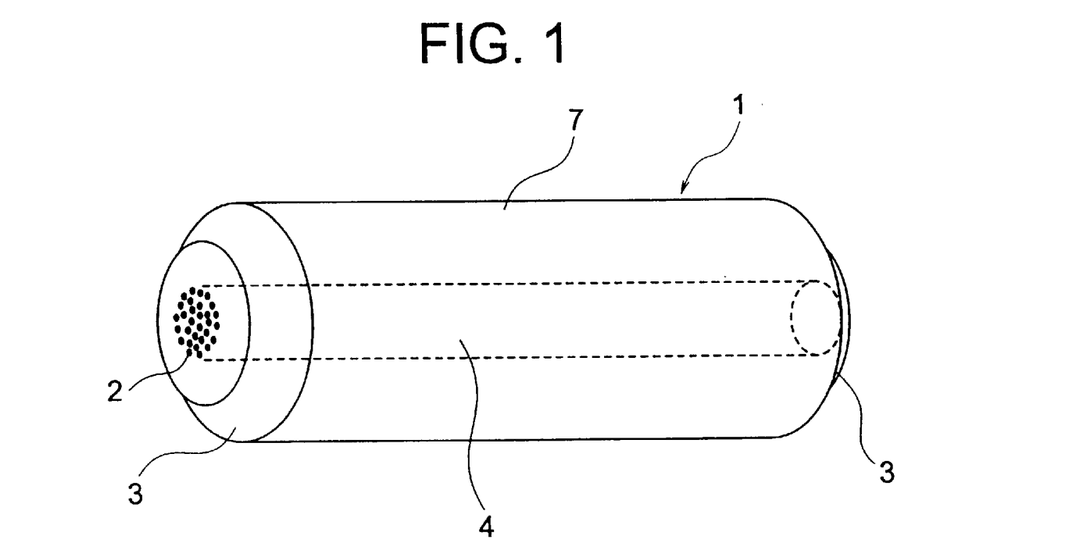
FIG. 1 is a perspective view of a composite vapor-deposition material in the first embodiment of the present invention.
Figure 2:
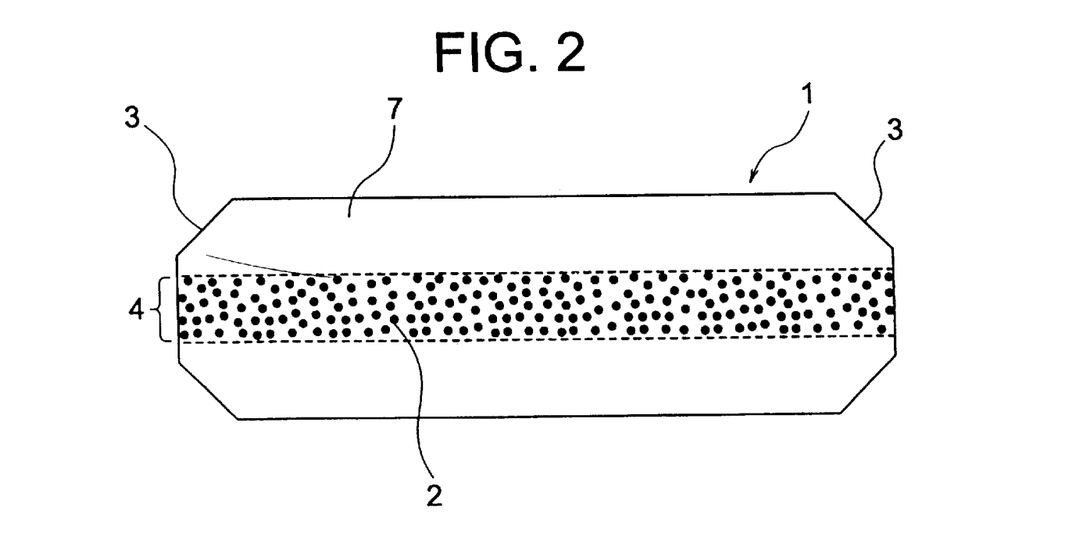
FIG. 2 is a cross-sectional view of a composite vapor-deposition material in the first embodiment of the present invention.

The present invention will be described in more detail, referring to the accompanying drawings. FIG. 1 is a perspective view showing the first embodiment of the composite vapor-deposition material according to the present invention, and FIG. 2 is a cross-sectional view of the first embodiment of the composite vapor-deposition material according to the present invention. Both figures show a composite vapor-deposition material comprising a cylindrical high vapor-pressure metal body 1, and a low vapor-pressure metal powder 2 dispersed in the core region of the high vapor-pressure metal body 1. Dotted lines correspond to the high vapor-pressure metal body core region 4 that is a region where the low vapor-pressure metal powder is chiefly dispersed in the high vapor-pressure metal powder. On the end face of the core region 4 there exists a portion where the low vapor-pressure metal powder 2 is exposed. Portions other than the core region 4 in the high vapor-pressure metal body 1 comprise the high vapor-pressure metal. Both end faces of the cylinder should preferably have chamfers 3.

In the present invention, a high vapor-pressure metal envelope, such as a sleeve, with a mixture of a high vapor-pressure metal powder and a low vapor-pressure metal powder packed into the cavity thereof is cold worked to reduce the diameter thereof, so that the low vapor-pressure metal powder packed into the inside can be integrated with the core portion of the high vapor-pressure metal body. To this end, the high vapor-pressure metal is required to have some ductility. The low vapor-pressure metal may be a material having low ductility, such as carbon, silicon, chromium and vanadium, or a material having some ductility, such as beryllium, gold, iron, cobalt, nickel, titanium, platinum, rhodium, niobium, tantalum, rhenium and tungsten.

To integrate the high vapor-pressure metal envelope, the high vapor-pressure metal powder and the low vapor-pressure metal powder into one piece with cold working, it is desirable to reach the total reduction ratio at not less than 75%. The total reduction ratio used here means the ratio of change in the cross-sectional area, S2, of a workpiece after several steps of cold working to the cross-sectional area, S1, before cold working; reduction ratio=(1−S2/S1)×100%.

Desirable cold working methods for forming a high vapor-pressure metal envelope include extrusion or wire drawing. In these cold working processes, a high vapor-pressure metal envelope is pulled or forced through a drawing or extruding die to reduce the cross section as a result of compression while elongating the length. This compression-elongation process does not require heating the high vapor-pressure metal body since it is considered that during cold working, the compressed and elongated high vapor-pressure metal powder starts plastic flow, or melts down locally, penetrating in between the low vapor-pressure metal powder. In the thinly drawn metal envelope, the low vapor-pressure metal powder are dispersed and held by the high vapor-pressure metal, and as a result, the high vapor-pressure metal envelope and the high vapor-pressure metal powder are integrated into a high vapor-pressure metal body 1 having a composite structure where the low vapor-pressure metal powder 2 is substantially dispersed in the core region 4 of the high vapor-pressure metal body 1. By repeating this cold working process several times, the metal envelope is drawn and elongated into a metal wire. When a material that is apt to cause work hardening during wire drawing is used as the metal envelope, a process of annealing the intermediate metal wire can be added for further wire drawing process.

Having the low vapor-pressure metal powder dispersed therein, the high vapor-pressure metal powder acts as a binder for integrally bonding the low vapor-pressure metal powder to the core portion of the high vapor-pressure metal body. To give full play to the binder effect of the high vapor-pressure metal powder, it is desirable in terms of the preparation of an elongated composite vapor-deposition material according to the present invention to establish the grain sizes of the high and low vapor-pressure metal powders, as well as the mixing ratio of the high and low vapor-pressure metal powders.

Too small an amount of the high vapor-pressure metal powder relative to the amount of the low vapor-pressure metal powder could cause the low vapor-pressure metal powder to be peeled off or drop off from the side surface of the composite material when the elongated composite vapor-deposition material wire is cut into chips. To the contrary, too small an amount of the low vapor-pressure metal powder relative to the high vapor-pressure metal powder could result in insufficient properties of the resulting composite material, though it has a satisfactory binder effect. It is desirable that the high vapor-pressure metal powder wraps the low vapor-pressure metal powder integrally with the high vapor-pressure metal envelope. Even in the state where particles of the high vapor-pressure metal powder are observed, it is sufficient to achieve an effect of binding the high vapor-pressure metal envelope to the low vapor-pressure metal powder.

An increase in the ratio of particles of larger particle sizes in the powder could make the distribution of the low vapor-pressure metal powder in the longitudinal direction of the elongated composite vapor-deposition material body uneven. To ensure an even distribution of the low vapor-pressure metal powder, therefore, the ratio of particles of smaller particle sizes is maintained, or an appropriate average particle size is established. The more the uniformity of particle sizes is improved, the better becomes the uniformity of particle size distribution in the longitudinal direction of the composite vapor-deposition material wire.

In this regard, it is desirable that particles with sizes under 30 $\mu$m of the low vapor-pressure metal powder be not less than 70% of the entire amount of the particles, and particles with sizes under 10 $\mu$m be not less than 70%. It is desirable that the average grain size at that time be within the range of 0.1 to 100 $\mu$m. It is more desirable that the average grain size be within the range of 0.1 to 40 $\mu$m to improve the uniformity of size distribution for dense particles.

In the vapor-deposition material according to the present invention, particles of sizes under 1 $\mu$m should preferably be not more than 10 wt. % of the low vapor-pressure metal powder. It is desirable to keep the mixing ratio of finer powder at a low level because too large amount of finer particles of the low vapor-pressure metal could unwantedly quicken the evaporation of the low vapor-pressure metal that is to be evaporated slowly.

The external appearance of the high vapor-pressure metal body may be of a columnar shape (cylinder, prism, etc.), a rod shape (pin or pellet), or a wire shape (wire). A wire can be bent freely to any desired shape. The high vapor-pressure metal body may be formed into a longer one by connecting pieces of the body in the longitudinal direction. The external shape of the high vapor-pressure metal body may be a strip, sheet, or quadrangular prism shape.

The amount of the low vapor-pressure metal powder dispersed in the high vapor-pressure metal body can be selected appropriately. That is, the alloy composition of the composite vapor-deposition material is selected appropriately in accordance with the desired composition of a composite vapor-deposited film that is to be prepared. When manufacturing a composite vapor-deposited film in which a high vapor-pressure metal-rich film is first deposited, the envelope of the composite vapor-deposition material must be made of a high vapor-pressure metal. And the low vapor-pressure metal must therefore be provided in the core region of the composite vapor-deposition material, because a low vapor-pressure metal-rich film be provided on the high vapor-pressure metal-rich film, that is, after the high vapor-pressure metal-rich film has been deposited. To manufacture a composite vapor-deposition material with cold working, the composite vapor-deposition material should be of a material having ductility, as described earlier.

The low vapor-pressure metal powder can be distributed uniformly in the core region of the cross section of the body, or in such a manner that the low vapor-pressure metal powder is distributed in higher density around the center of the core region of the body cross section, and in lower density near the outer periphery of the core region cross section, or in such a manner that the density of the low vapor-pressure metal powder is gradually decreased from the center of the body cross section to the outer periphery thereof. When the metal body is of a wire shape or a columnar shape, it is most desirable that the low vapor-pressure metal powder be distributed uniformly in the core region of the metal body cross section. By doing this, the low vapor-pressure metal powder can be prevented from being exposed on the surface of the metal body even when the diameter of the metal body is reduced. This is favorable in protecting the low vapor-pressure metal powder from exposure. The cross section of the metal body means the cross section of the metal body when it is cut in the direction orthogonally intersecting with the longitudinal direction. The metal body should have a uniform distribution of particles in the longitudinal direction.

The mixing ratio of the high vapor-pressure metal powder and the low vapor-pressure metal powder, when expressed as [wt. % of low vapor-pressure metal powder/wt. % of high vapor-pressure metal powder], should be 0.5 to 19. More preferably, the mixing ratio should be within the range of 2 to 15 to improve the uniformity of distribution of the powder mix.

According to a report prepared by R. E. Honig "RCA Review" 23 567 (1962), the vapor pressures of metallic materials are as shown in TABLE 1. Possible combinations of low vapor-pressure metal and high vapor-pressure metal may be selected by referring to this table and others.

TABLE 1

|    | Degrees K. | | Degrees C. | |
|----|---|---|---|---|
|    | $1 \times 10^{-4}$ torr | $1 \times 10^{-6}$ torr | $1 \times 10^{-4}$ torr | $1 \times 10^{-6}$ torr |
| Cd | 440  | 390  | 167  | 117  |
| Zn | 510  | 480  | 237  | 207  |
| Mg | 640  | 550  | 367  | 277  |
| Pb | 830  | 700  | 557  | 427  |
| In | 1000 | 860  | 727  | 587  |
| Ag | 1100 | 950  | 827  | 677  |
| Al | 1250 | 1080 | 977  | 807  |
| Be | 1300 | 1100 | 1027 | 827  |
| Sn | 1280 | 1100 | 1007 | 827  |
| Cu | 1300 | 1110 | 1027 | 837  |
| Au | 1400 | 1200 | 1127 | 927  |
| Cr | 1430 | 1250 | 1157 | 977  |
| Fe | 1450 | 1300 | 1177 | 1027 |
| Co | 1510 | 1320 | 1237 | 1047 |
| Ni | 1550 | 1330 | 1277 | 1057 |
| Si | 1620 | 1400 | 1347 | 1127 |
| Ti | 1800 | 1500 | 1527 | 1227 |
| V  | 1900 | 1600 | 1627 | 1327 |
| Pt | 2000 | 1720 | 1727 | 1447 |
| Rh | 2000 | 1750 | 1727 | 1477 |
| Th | 2280 | 1900 | 2007 | 1627 |
| Ru | 2300 | 2000 | 2027 | 1727 |
| Mo | 2400 | 2100 | 2127 | 1827 |
| C  | 2400 | 2150 | 2127 | 1877 |
| Nb | 2550 | 2250 | 2277 | 1977 |
| Os | 2750 | 2300 | 2477 | 2027 |
| Ta | 2900 | 2500 | 2627 | 2227 |
| Re | 2880 | 2500 | 2607 | 2227 |
| W  | 3000 | 2700 | 2727 | 2427 |

When aluminum, copper or their alloy that is ductile is used as a high vapor-pressure metal, any metal having a lower vapor pressure than aluminum or copper, that is, any metal that shows a higher temperature for the same vapor pressure, as given in TABLE 1, is selected as a low vapor-pressure metal. For a deposited film on a phosphor surface of a CRT, aluminum that is highly reflective is selected as a high vapor-pressure metal, and carbon or chromium that has good absorption of radiant heat is selected as a low vapor-pressure metal.

As a low vapor-pressure metal powder used for a composite vapor-deposition material in the first embodiment of the present invention, particles of a spherical, oval, hexahedral, octahedral or any other polyhedral, strip, flake, needle, ground rock, sand shape, or amorphous shape that has no definite form, or any of their combined forms may be used. Furthermore, not only particles of a single type but also particles combining multiple types of particles may be used. Moreover, not only particles comprising a single element but also a mixture of particles comprising two or more elements or an alloy powder may be used.

Any additive that has the following effect may be used in the low vapor-pressure metal powder; smoothening the surface of metal powder particles, preventing particles from being statically charged, preventing the friction or adsorption of metal powder particles, and facilitating the dispersion of metal powder particles. The additive used may be of a powder, granular, liquid, or a combination of at least one or more of them. Any anti-friction agent, such as aluminum stearate, and zinc stearate, may be used.

Figure 3:
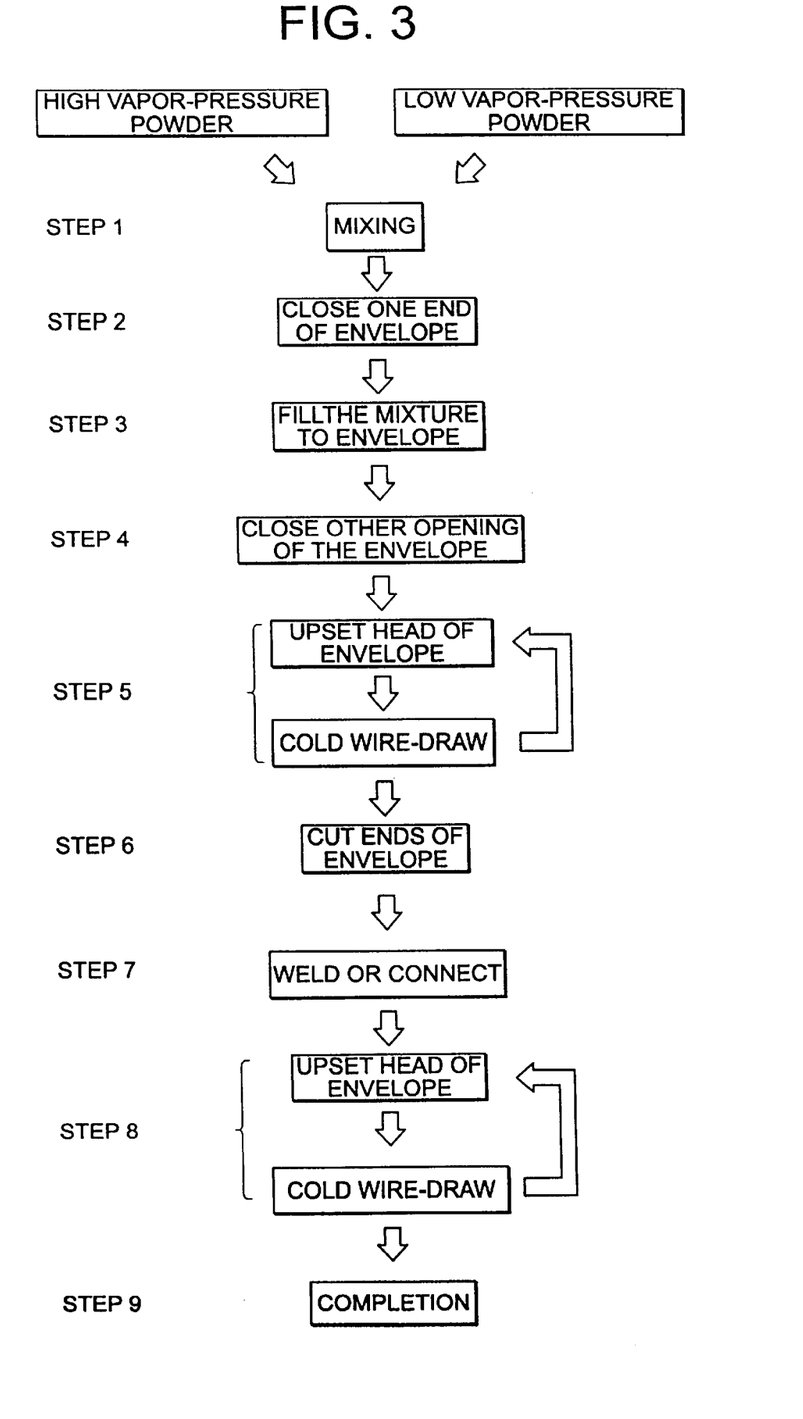
FIG. 3 is a block diagram of assistance in explaining the manufacturing process for the composite material according to the present invention.
Figure 4:
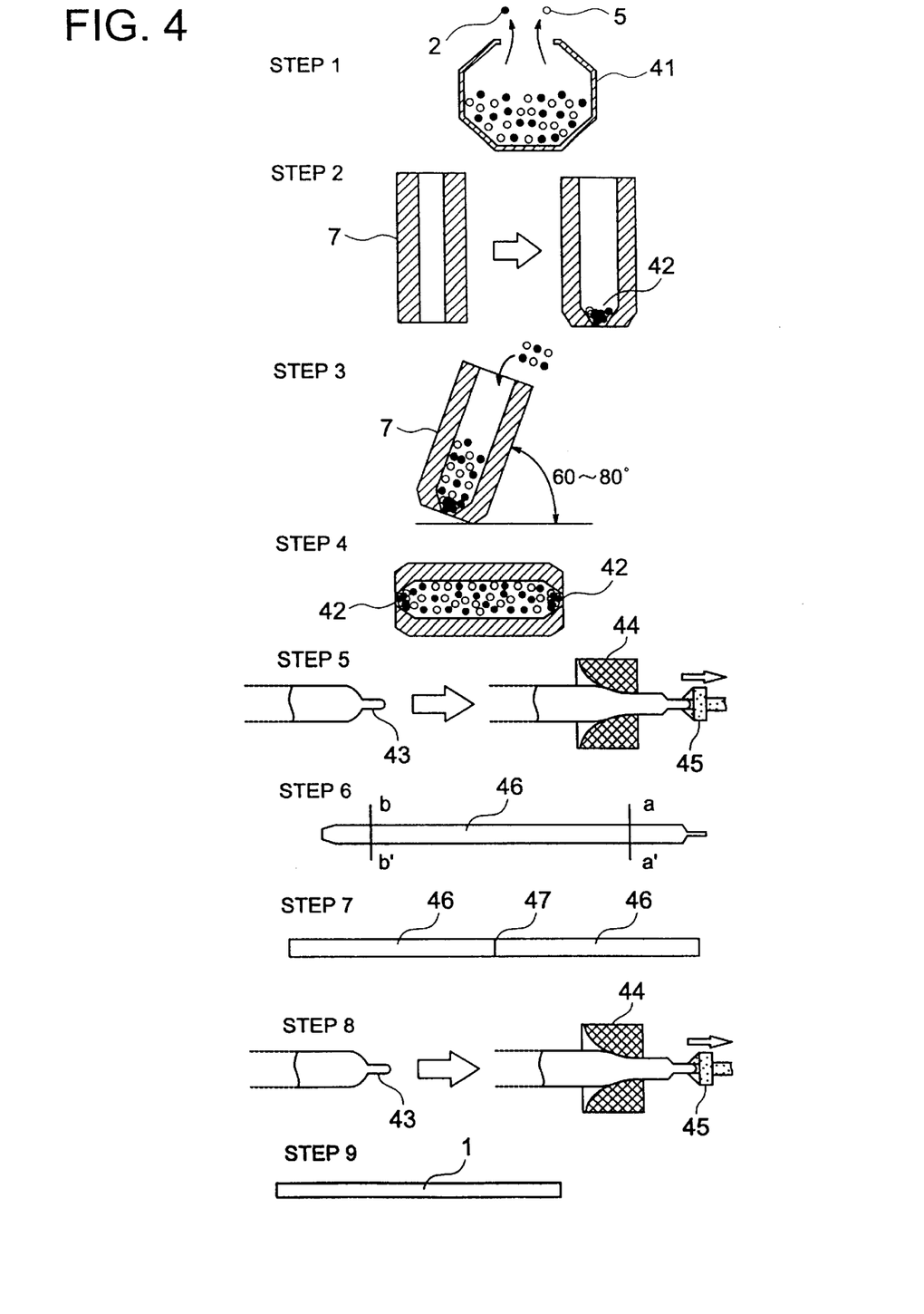
FIG. 4 is a schematic diagram of assistance in explaining the manufacturing process for the composite material according to the present invention.

An embodiment of the process for manufacturing composite vapor-deposition materials according to the present invention will be described in the following, referring to FIGS. 3 and 4, flow charts of the process. A high vapor-pressure metal powder 5 and a low vapor-pressure metal powder 2 are first charged into a sealed container 41 filled with inert gas, a V-type mixer, for example, and mixed uniformly by rotating and rocking the sealed container 41 (Step 1). At this step, inert gas may be injected to prevent the oxidation or explosion of the powder. Furthermore, the powder may be mixed safely by grounding part of the container to prevent static charge to reduce explosion hazards.

When a low ductile metal powder 2, such as carbon, silicon, chromium or vanadium, is mixed with a ductile high vapor-pressure metal powder 5, such as aluminum or its alloy, a mixture of these powders may have too low fluidity to enable cold working. The powder mix should therefore have sufficient fluidity to enable cold working. In this connection, the powder mix should preferably have an angle of repose not greater than 45 degrees, more preferably not greater than 35 degrees. The angle of repose is defined as an angle between the bottom and slope of a cone formed by the powder mix when dumped from a height of 10 cm and allowed to fall freely. In general, the smaller the angle of repose is, the better the fluidity of a powder.

The high vapor-pressure metal envelope 7, such as an aluminum sleeve should preferably be pickled, water-rinsed and dried to remove foreign matter, such as oil, etc., and oxide films from the high vapor-pressure metal envelope, particularly the inside surface thereof before pouring a mixture of the high vapor-pressure metal powder 5 and the low vapor-pressure metal powder 2 into a cavity of the envelope 7.

Next, the inside diameter of an open end of the high vapor-pressure metal envelope 7 is somewhat reduced. The open end whose inside diameter has been reduced of the high vapor-pressure metal envelope 7 is closed with an air permeable plug 42, made of stainless-wire wadding (Step 2). The envelope 7 is inclined to an angle of 60 to 80 degrees with respect to the horizontal plane, the powder mix is poured into the cavity of the envelope 7 by gravity from an opening at the other end of envelope 7, and compacted into the cavity of the envelope 7 placed almost upright on the horizontal plane by tamping it with a rod (Step 3). Filling the powder mix into an envelope inclined at an angle of not less than 80 degrees would prevent the air from escaping from the envelope, with the result that a bridge of the powder mixture is formed, leading to an air reservoir that hampers perfect filling. Filling the powder mix into an envelope inclined at angle of not more than 60 degrees and at the time standing the envelope almost upright is not desirable because it would tend to cause bridges of the powder mix. The powder mix can be positively filled by free fall into the envelope by controlling the inclination angle of the envelope when charging the powder mix, and the angle of repose of the powder mix. Packing density can be increased by giving vibrations to the envelope or tamping the powder mix with a rod.

Then, the opening at the other end of the envelope filled with the powder mix is closed by placing an air permeable plug 42 (Step 4). An 18 μmdia. stainless steel wadding ball having air permeability and elasticity to retain the powder is desirable for the breathable plug. The air permeable plug acts as a vent hole to remove the air present in between the particles of the powder mix during the next cold working process. By removing the air inside the powder, strong adhesion between the high vapor-pressure metal body and the low vapor-pressure metal powder can be accomplished.

The next process is cold working for elongating the high vapor-pressure metal envelope packed with the metal powder mix. Cold working includes extrusion or drawing (sometimes referred to as wire drawing). In this process, the envelope is passed through a wire drawing or extruding die to compress the envelope in the diametrical direction, thus reducing the cross section and elongating the length.

An end of the envelope 7 is hit uniformly with a device called an upsetter to form a grip 43 whose diameter is smaller than the diameter of the die opening. The length of the upsetter 43 can be approximately 40 mm. The grip 43 is threaded into the opening of the wire drawing die 44 and held by a drawbench 45, which is driven to impart a tensile load to draw the envelope 7 through the wire-drawing die opening 44. The drawing rate is approximately 30 /min, for example. The outside diameter of the drawn envelope is reduced while drawn through the diameter of the die opening.

This process is called the wire drawing process. Next, the wire drawing die is changed to that of a smaller diameter to further reduce the diameter of the envelope in the subsequent drawing process. The grip 43 whose diameter must be smaller than the diameter of the wire drawing die used is formed appropriately before each drawing process. By repeating this process, the outside diameter of the envelope is gradually reduced until a metal wire of a specified outside diameter can be obtained (Step 5). Although no heat treatment is given to the envelope during the wire drawing process, the high vapor-pressure metal powder compressed during the cold drawing process is likely to penetrate in between the particles of the low vapor-pressure metal powder due to the plastic flow or local melting thereof by the heat generated by the friction of the particles. Thus, the high vapor-pressure metal is filled between the thinly drawn high vapor-pressure metal envelope and the low vapor-pressure metal powder, and formed into an integral structure where the low vapor-pressure metal powder is dispersed substantially in the core region of the high vapor-pressure metal body.

Ends of the drawn envelope closed by the air permeable plugs are cut off at a-a' and b-b' to obtain a 2 mm-dia. wire, for example, of a specified diameter in which the low vapor-pressure metal powder is dispersed in the core region of the high vapor-pressure metal body (Step 6). By cutting to a specified length and chamfering the wire obtained, a chip of the composite material in which the low vapor-pressure metal powder is dispersed in the core region of the high vapor-pressure metal body.

In the dividing process, a chip of the composite material is obtained by cutting or wrenching off the metal wire to a specified length. Ends of the chip is chamfered to facilitate its automatic feeding in a parts feeder and to remove burrs on the end face. It is desirable to remove corners at the ends of the side surface (the surface in the longitudinal direction) of the composite vapor-deposition material by chamfering. Both wire cutting and chamfering or end-face rounding can be performed simultaneously. End-face rounding may be upsetting corners at the ends of the chip toward the side surface thereof.

Alternatively, an approx. 1.9 m-long metal wire 46 in which the low vapor-pressure metal powder is dispersed in the core region of the high vapor-pressure metal body can be obtained by cutting off an about 100 mm-long portions where the powder mix plugs (the air permeable plugs) are placed from the envelope as cold worked to an outside diameter (7.5 mm, for example) without further cold working the envelope until a specified outside diameter is obtained (Step 6). End faces of a plurality of the metal wires 46 thus obtained are connected to each other by butt welding to obtain a metal wire of a desired length. A built-up portion at the joint 47 is blended out by filing or other means to the same diameter as the other parts of the wire (Step 7).

The connected metal wire is further drawn in the same process as shown in Step 5 to gradually reduce the cross section. As the wire is elongated by repeating wire drawing operations, the drawn wire can be would on a roll. Thus, the wire is drawn to an intended diameter, 2 mm, for example (Step 8). By cutting to a specified length and chamfering the metal wire, as described above, a composite material 1 in which the low vapor-pressure metal powder is dispersed in the core region of the high vapor-pressure metal body is obtained (Step 9).

Figure 5:
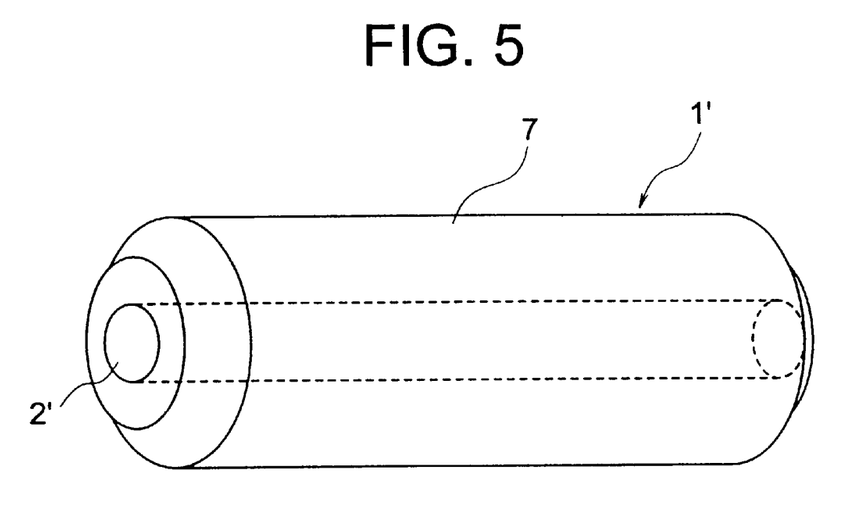
FIG. 5 is a perspective view of a composite vapor-deposition material in another embodiment of the present invention.

FIG. 5 is a perspective view illustrating another embodiment 1' of the composite vapor-deposition material according to the present invention. In the figure, numeral 7 refers to a high vapor-pressure metal envelope, and 2' to a low vapor-pressure metal rod. The high vapor-pressure metal envelope 7 is made of a ductile metal, such as aluminum or its alloy, while the low vapor-pressure metal rod 2' is made of at least one element selected from among beryllium, tin, gold, iron, cobalt, nickel, titanium, platinum rhodium, niobium, tantalum, rhenium and tungsten. Since these metals have some ductility, they can be cold worked, together with the high vapor-pressure metal envelope 7.

This composite vapor-deposition material 1' can be formed into a clad wire having the low vapor-pressure metal rod 2' in the core region of the high vapor-pressure metal envelope by inserting the low vapor-pressure metal rod 2' into the hollow part of the high vapor-pressure metal envelope 7, such as a sleeve, and subjecting it to cold working, such as cold wire drawing.

Figure 6:
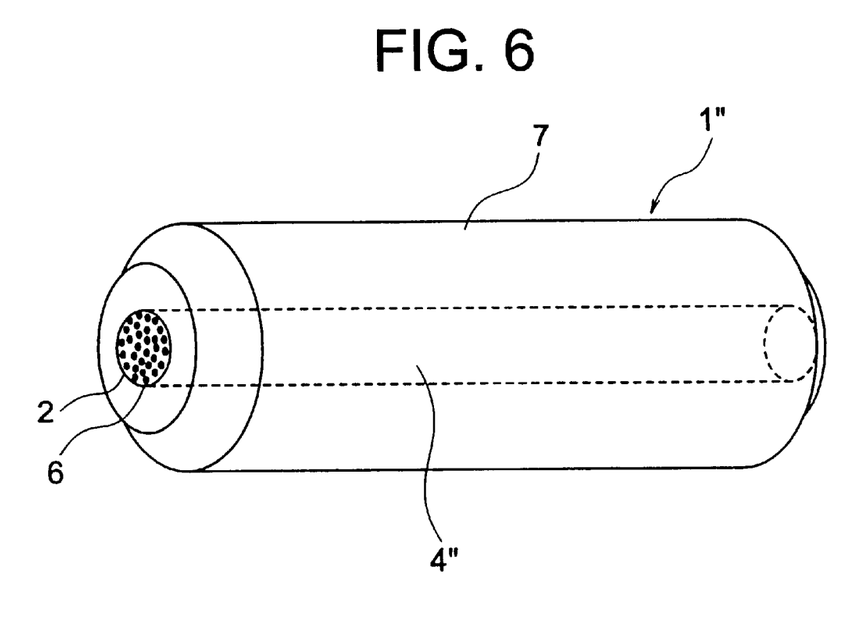
FIG. 6 is a perspective view of a composite vapor-deposition material in still another embodiment of the present invention.

FIG. 6 is a perspective view of still another embodiment of the composite vapor-deposition material 1" according to the present invention. In the figure, numeral 7 refers to a high vapor-pressure metal envelope, and 2 refers to a low vapor-pressure metal powder. The core region 4" of the composite vapor-deposition material 1" contains a mixture of the high vapor-pressure metal powder and the low vapor-pressure metal powder. The core region 4" is enclosed by a foil or layer 6 comprising a metal of a still lower vapor pressure. The high vapor-pressure metal envelope 7, the high and low vapor-pressure metal powders are the same as used in the composite vapor-deposition material 1 in the first embodiment shown in FIGS. 1 and 2. The foil or layer 6 comprising a metal of a still lower vapor pressure enclosing the core region 4" should preferably be a metal such as niobium, tantalum, rhenium and tungsten.

The composite vapor-deposition material 1" can be manufactured by inserting a foil or layer comprising a metal having a still lower vapor pressure along the inner wall of the hollow part of the high vapor-pressure metal sleeve, filling the hollow part with a mixture of the high vapor-pressure metal powder and the low vapor-pressure metal powder, and cold working, such as cold wire drawing, the envelope, as in the case of the aforementioned first embodiment.

In the composite vapor-deposition material 1' in the embodiment shown in FIG. 5, too, a foil or layer comprising a metal having a still lower vapor pressure may be provided in such a manner as to enclose the low vapor-pressure metal rod 2' inserted into the core region.

By heating under reduced pressure the composite vapor-deposition materials 1 and 1' according to the present invention, the high vapor-pressure metal and the low vapor-pressure metal can be deposited on a substrate being deposited. Since the outer circumferential surface of the composite vapor-deposition material is covered by the high vapor-pressure metal, a deposited film comprising the high vapor-pressure metal is formed in the initial stage of evaporation. Although the low vapor-pressure metal may sometimes be included in the vapor-deposited film formed in the initial stage of evaporation because some of the low vapor-pressure metal is exposed at ends of the composite vapor deposition material, it is very small in amount. As evaporation proceeds and the high vapor-pressure metal in the envelope of the composite vapor-deposition material is almost used up, the core region becomes exposed, allowing both the high and low vapor-pressure metals to evaporate. At the stage, evaporation proceeds in accordance with the difference in vapor pressure. Thus, the resulting vapor-deposited film is rich in the high vapor-pressure metal, in which the low vapor-pressure metal is partially included. As the high vapor-pressure metal first evaporates and decreases in volume in this way, the composition of the deposited film gradually becomes rich in the low vapor-pressure metal, resulting in a deposited film comprising solely the low vapor-pressure metal at the final stage.

When a composite vapor-deposition material as shown in FIGS. 1 and 2 is prepared by using aluminum as the high vapor-pressure metal and carbon as the low vapor-pressure metal, and a composite vapor-deposited film is formed on the phosphor faceplate of a CRT, a composite vapor-deposited film having almost 100% of aluminum in the initial stage of evaporation and almost 100% of carbon at the final stage can be formed. A composite deposited film comprising aluminum and chromium will be described in more detail later.

When deposition is carried out using a composite vapor-deposition material with a core region 4" of the high vapor-pressure metal envelope 7 enclosed by a still lower vapor-pressure metal 6, as shown in FIG. 6, the change in the concentration of ingredients in the vapor-deposited film becomes more steep. In the initial stage of evaporation, only the high vapor-pressure metal in the envelop of the composite vapor deposition material is deposited, and the content of the low vapor-pressure metal in the deposited film is extremely low because only the low vapor-pressure metal exposed from the end face takes part in evaporation. Once all the high vapor-pressure metal in the envelope has evaporated, a foil or layer of a still lower vapor-pressure metal is exposed to the surface, but it is slow in evaporation rate due to its extremely low vapor pressure. As a result, the still lower vapor-pressure metal comprising the foil or layer evaporates only after the high vapor-pressure metal vapor in the evaporation chamber becomes dilute. After part of the foil or layer is ruptured, the metal comprising the core evaporates. It is considered that the change in the concentrations of ingredients in the deposited film increases because the low vapor-pressure metal evaporates at this stage.

EXAMPLE 1

In this EXAMPLE, a composite vapor-deposition material as shown in FIGS. 1 and 2 was prepared as the composite vapor-deposition material for changing the composition of the deposited film at the initial and final stages of evaporation. The composite vapor-deposition material is 2.0 mm in outside diameter and 14 mm in length, with a chamfer of 0.3 mm at the end face. This composite vapor-deposition material has low vapor-pressure metal powder 2 comprising chromium powder dispersed and held by aluminum powder in an about 0.7~0.9 mm-dia. core region 4, as shown by dotted lines in the figure, of a high vapor-pressure metal body 1 comprising an aluminum tube. Note that aluminum has ductility while chromium has little ductility.

To prepare this composite vapor-deposition material, an aluminum tube of 15.0 mm in outside diameter, 6.25 mm in inside diameter, 350 mm in length was used as a high vapor-pressure metal envelope, an aluminum powder with an average particle size of 75 $\mu$m as high vapor-pressure metal powder, and a chromium powder with an average particle size of 10 $\mu$m as low vapor-pressure metal powder.

A powder obtained by mixing 80 wt. % of chromium and 20 wt. % of aluminum (angle of repose: 33 to 40 degrees) was prepared. This powder mix was charged into the aluminum tube, and both open ends of the tube were closed with plugs made of 18-$\mu$m-dia. stainless-steel wire wadding. The aluminum tube was cold drawing in the cold wire drawing process shown in FIGS. 3 and 4 until the outside diameter of the aluminum tube was reduced to 2.0 mm, and the diameter of the core region to 0.85 mm. The chromium content of the drawn aluminum tube was approximately 15 wt. %.

Figure 7:
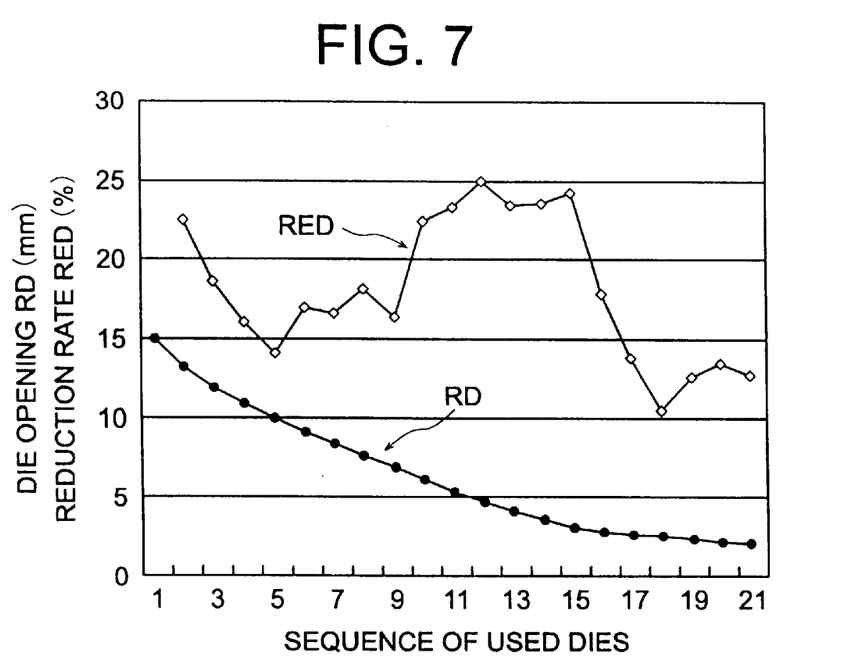
FIG. 7 is a graph showing the relationship between the diameters, Rd (mm), of die openings and the reduction ratios, Red (%), in successive steps of cold wire drawing process for manufacturing a composite material according to the present invention.

In reducing an aluminum tube from 15.0 mm to 2.0 mm in outside diameter in the cold wire drawing process, 20 types of wire drawing dies were used, with a cross-sectional reduction rate of approximately 10 to 25% in a single drawing operation. The opening diameters Rd (mm) and reduction rates Red. (%)of the dies used here are shown in FIG. 7. The reduction rate, Red.=(1-cross-sectional area after drawing/cross-sectional area before drawing)×100 (%). When the outside diameter is reduced to 2.0 mm, an aluminum wire was obtained, with the aluminum particles and the aluminum tube formed into an integral aluminum body in the core region of which chromium particles were dispersed. Cold wire drawing was carried out at normal temperatures and atmospheric pressure. Although the wire drawing rate per wire drawing can be increased and the number of wire drawing dies can be reduced accordingly by carrying out hot wire drawing, it is necessary to take measures to prevent aluminum and chromium from being oxidized by atmospheric oxygen in the aluminum tube. Taking into account this problem, it seems easier in terms of manufacture to reduce the reduction rate per wire drawing operation and increase the number of drawing operations.

Next, the drawn aluminum wire was cut into a length of 14 mm with a cutter to obtain a chip of a specified length. Chamfering was carried out with a lathe, but it can be done using a press. Cutting and chamfering or end rounding can be performed simultaneously. Being a round bar shape having chamfers as shown in FIGS. 1 and 2, the composite vapor-deposition material could be supplied to the vacuum deposition apparatus without a hitch even by positioning, orienting and transporting the material by a vibratory parts feeder. Tests conducted to supply composite vapor-deposition materials having no chamfers revealed that positioning, orientation and transportation were not properly performed because end faces of some composite vapor-deposition materials interfered with the walls of the parts feeder, or composite vapor-deposition materials themselves interfered with each other. Chamfering the end face to C 1 mm, that is, machining the end face into a conical shape, tended to cause a composite vapor-deposition material to slip under another material, resulting in inadequate positioning, orientation and transportation. It follows from these experiences that the most suitable chamfering size is C 0.3 to 0.6 mm to ensure smooth positioning, orientation and transportation. Note that the most suitable chamfering size given above can be applied to a composite vapor-deposition material of 2 mm in outside diameter and 14 mm in length; the optimum value varies with changes in outside diameter and length. In general, chamfering should preferably be 15 to 30% of the approximate outside diameter. Although chamfering was carried out in the embodiment, providing corner radii with curved surfaces may be used in place of chamfering.

Figure 8:
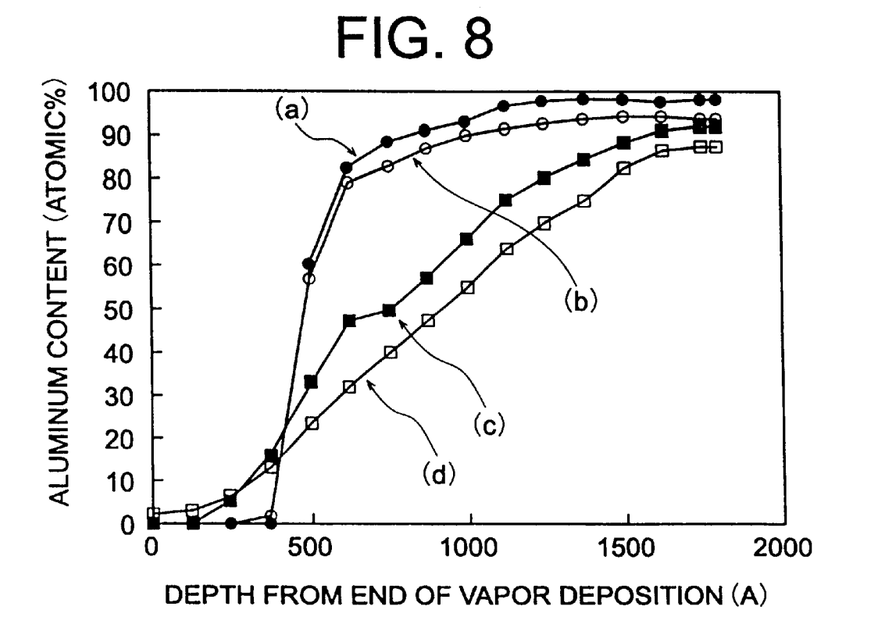
FIG. 8 is a graph showing the aluminum contents (%) of a deposited film deposited using a composite material according to the present invention and a composite vapor-deposition material for comparison, in relation to the deposited film depth (angstrom)

The relationship between the composition of deposited films and film thicknesses using the composite vapor deposition material according to the present invention and a comparison material is shown in FIG. 8. In FIG. 8, curve (a) represents the test results on the composite vapor deposition material of the present invention, curve (b) represents those on the comparison material. The comparison material used here was obtained by weighing and mixing an aluminum powder having the average particle size of 75 μm and chromium powder having the average particle size of 10 μm to make a mixture of 85 wt. % aluminum and 15 wt. % chromium, temporarily formed in a hydraulic press, and sintered in a vacuum hot press under conditions; temperature: 600° C., pressure: 0.3 t/cm$^2$, and the degree of vacuum: 10$^{-4}$ torr. The sintered material was machined into a material of 2 mm in outside diameter, 14 mm in length, with a chamfer of 0.3 mm.

Deposited films were formed using the composite vapor-deposition material according to the present invention and the comparison material. A vapor-deposition material and a glass substrate were placed in a bell jar of a vacuum apparatus, and heated and evaporated to form an aluminum-chromium deposited film on the glass substrate. The resulting deposited film was an aluminum-chromium alloy film, with an aluminum-rich layer formed on the side of the glass substrate, that is, in the initial stage of evaporation, and a chromium-rich layer formed in the final stage. The glass substrate used was of a chemical composition containing neither aluminum nor chromium to improve analysis accuracy.

The deposition conditions were; the degree of vacuum: 1~5×10$^{-5}$ torr, voltage applied: 3.5 V, deposition time—70 seconds, the evaporation tray on which the vapor-deposition material was placed: a boron nitride tray, and the aimed deposited film thickness: 1800Å. The film deposited on the glass substrate was analyzed by an Auger electron spectroscopy apparatus to determine the through-the-thickness alloy composition of the film.

As shown in FIG. 8, when the composite vapor-deposition material of the present invention was used (a), the film composition in the initial state of evaporation was almost 100% aluminum, while that in the final stage was 100% chromium. When the comparison material was used (b), on the other hand, the film composition at the initial stage was approx. 92% aluminum. It might be considered that with the composite vapor-deposition material of the present invention, aluminum comprising the envelope is evaporated in the initial stage, with little chromium in the core evaporated. Only after the envelope has been used up, aluminum and chromium particles in the core begins evaporating and mixing with each other into an alloy. At this stage, aluminum having higher vapor pressure is predominantly evaporated, and subsequently chromium having lower vapor pressure is evaporated. Thus, a deposited film having a composition of an aluminum-chromium alloy or mixture is formed in the intermediate stage of evaporation. When the core region is evaporated, aluminum is evaporated earlier than chromium, with the result that chromium is left in the core region after aluminum has been entirely consumed. For this reason, only chromium is evaporated in the final stage of evaporation, leading to a 100% chromium deposited film.

With the comparison material where both aluminum and chromium powders exist on the surface, on the other hand, a film having 7~8% chromium in aluminum was formed in the initial stage of evaporation due to the difference in vapor pressure between both elements.

Figure 9:
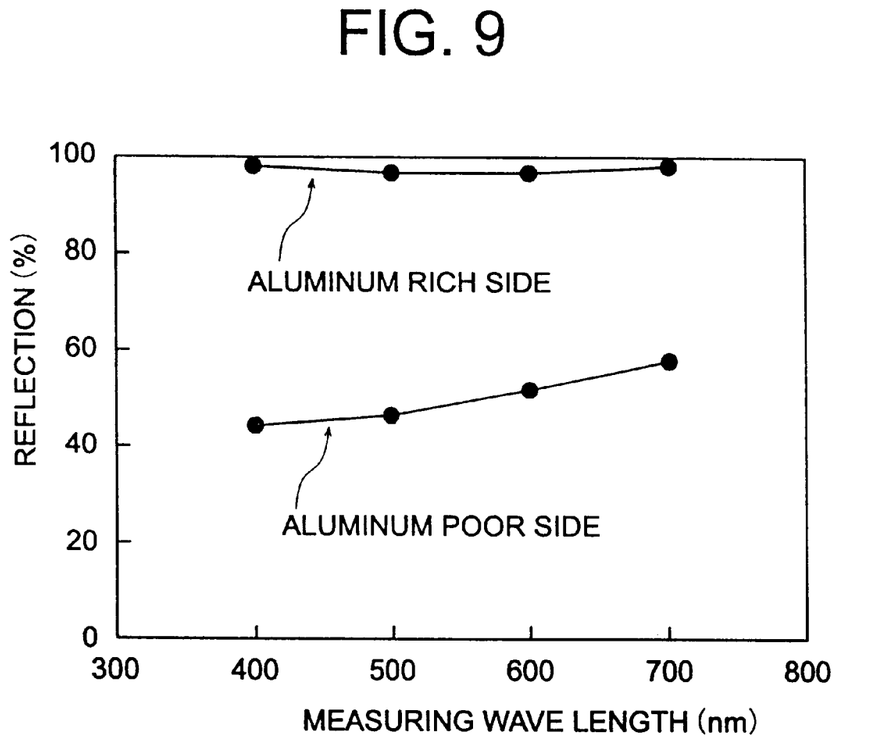
FIG. 9 is a graph showing the reflectivity of a composite deposited film prepared according to the present invention.

Measurement results of the light reflectivity of a composite deposited film (a) prepared in the above process is shown in FIG. 9, which shows the reflectivity as expressed in a percentage of the light reflectivity of a 99.99 wt. %-pure aluminum deposited film of 100%, with the abscissa representing the wavelength of light used in measurements. The upper curve represents the light reflectivity of an almost 100% aluminum film formed in the initial stage of evaporation, while the lower curve represents the light reflectivity of a 100% chromium film formed in the final stage.

The aluminum-chromium deposited film obtained according to the present invention contains almost 100% aluminum in the initial stage of evaporation has a light reflectivity of over 95%, and the film formed in the final stage has a reflectivity of 60% for light having a wavelength of 700 nm, near to the infrared region. Thus, it is suitable for depositing a film on the phosphor surface of television CRT tubes.

EXAMPLE 2

A composite vapor-deposition material according to the present invention having an aluminum-tin composition was prepared by inserting a tin rod into an aluminum envelope and drawing the entire envelope, and a composite vapor-deposition material for comparison was prepared by hot pressing aluminum and tin powders. The comparison material was hot pressed at a temperature of 200° C. because tin powder was used in it.

Using the composite vapor-deposition material according to the present invention and the comparison aluminum-tin composite vapor-deposition material, composite deposited films were formed on glass substrate, as in the case of Embodiment 1. Analysis results of the through-the-thickness composition of these films with an Auger electron spectroscopy apparatus are shown in FIG. 8. The film formed using the composite evaporation film according to the present invention has an aluminum content of over 90% in the initial stage of evaporation, and a tin content of 100% in the final stage of evaporation, as shown in FIG. 8(c). The film formed using the comparison material, on the other hand, has an aluminum content of 85% in the initial stage, and of a few percent in the final stage, as shown in FIG. 8(d).

What is claimed is:

1. A method for forming a composite deposited film with varied compositions formed in an initial and a final stage of evaporation, comprising the steps of:

heating under a reduced pressure a composite vapor deposition material which comprises a high vapor pressure metal envelope having a cavity therein, and a mixture of a high vapor pressure metal powder and a low vapor metal powder packed in the cavity and formed in a composite structure, the low vapor pressure metal powder being dispersed and held by the high vapor pressure metal powder in a core region of the high vapor pressure metal body and distributed uniformly in the longitudinal direction of the body, and vaporizing the high and low vapor pressure metals to deposit a composite deposited film on a substrate being deposited, the composite deposited film being rich in the high vapor pressure metal in an initial evaporation stage, rich in the low pressure metal in a final evaporation stage and of varied composition in an intermediate stage between the initial evaporation stage and the final evaporation stage.

2. A method as set forth in claim 1, wherein the high vapor pressure metal body and the high vapor pressure metal powder are formed of the same metal.

3. A method as set forth in claim 2, wherein the high vapor pressure metal is more ductile than the low vapor pressure metal.

4. A method as set forth in claim 3, wherein the high vapor pressure metal is aluminum or an alloy thereof, and the low vapor pressure metal powder is at least one element selected from the group consisting of carbon, silicon, chromium, nickel, iron, cobalt, titanium, rhenium, tungsten and vanadium.

5. A method for forming a composite deposited film with varied compositions formed in an initial and a final stage of evaporation, comprising the steps of:

mixing a powder of aluminum or an alloy thereof with a powder of a metal whose vapor pressure is lower than the aluminum or the alloy thereof to form a mixture of the powders, packing the mixture of the powders into an envelope made of aluminum or an alloy thereof, cold working the envelope to reduce a diameter thereof to obtain a composite structure to disperse the low vapor pressure metal powder in a core region of the envelope and distribute the low vapor pressure powder uniformly in a longitudinal direction of the core region, heating the composite structure under a reduced pressure, and vaporizing the high and low vapor pressure metals to deposit a composite deposited film on a substrate being deposited, the composite deposited film being rich in the high vapor pressure metal in an initial evaporation stage, rich in the low pressure metal in a final evaporation stage and of varied composition in an intermediate stage between the initial evaporation stage and the final evaporation stage.

6. A method as set forth in claim 5, wherein the cold working is cold wire drawing.

7. A method as set forth in claim 6, wherein the low vapor pressure metal powder is at least one element selected from the group consisting of carbon, silicon, chromium, nickel, iron, cobalt, titanium, rhenium, tungsten and vanadium.

* * * * *